United States Patent [19]

Evans et al.

[11] 3,904,450

[45] Sept. 9, 1975

[54] METHOD OF FABRICATING INJECTION LOGIC INTEGRATED CIRCUITS USING OXIDE ISOLATION

[75] Inventors: William Joshua Evans; Wesley Norman Grant, both of Berkeley Heights; Bernard Thomas Murphy, New Providence, all of N.J.

[73] Assignee: Bell Telephone Laboratories, Incorporated, Murray Hill, N.J.

[22] Filed: Apr. 26, 1974

[21] Appl. No.: 464,480

[52] U.S. Cl. .................... 148/175; 29/577; 29/578; 148/1.5; 148/174; 148/188; 357/35; 357/44; 357/46; 357/49; 357/59

[51] Int. Cl.² ....................H01L 21/76; H01L 27/02; H01L 21/22

[58] Field of Search ............ 148/174, 175, 188, 1.5; 357/35, 44, 46, 49, 59; 29/577, 578

[56] References Cited

UNITED STATES PATENTS

| | | | |
|---|---|---|---|
| 3,460,007 | 8/1969 | Scott | 148/175 UX |
| 3,519,901 | 7/1970 | Bean et al. | 148/174 |
| 3,534,234 | 10/1970 | Clevenger | 357/46 X |
| 3,602,982 | 9/1971 | Kooi | 357/46 X |

OTHER PUBLICATIONS

Wiedmann, S., "Injection–Coupled Memory: . . . Bipolar Memory", IEEE J. Solid State Circuits, Vol. SC–8, No. 5, Oct. 1973, p. 332–337.

Evans et al., "Oxide–Isolated Monolithic Technology and Applications", Ibid., Vol. SC–8, No. 5, Oct. 1973, p. 373–380.

*Primary Examiner*—C. Lovell
*Assistant Examiner*—W. G. Saba
*Attorney, Agent, or Firm*—P. Abolins; P. V. D. Wilde

[57] ABSTRACT

An integrated injection logic circuit cell structure and its fabrication are simplified. A pattern of oxide isolation regions is used to define, at least partially, the introduction of two types of impurities in such a way as to reduce the number of masking steps. Certain of these oxide regions do not penetrate through the conventional epitaxial layer, leaving a lateral buried path to serve as the base of a lateral injection transistor. A pattern of polycrystalline silicon containing impurities is used both as a diffusion source and an interconnection.

7 Claims, 5 Drawing Figures

PATENTED SEP 9 1975 3,904,450

METHOD OF FABRICATING INJECTION LOGIC INTEGRATED CIRCUITS USING OXIDE ISOLATION

BACKGROUND OF THE INVENTION

This invention relates to semiconductor devices and their fabrication; and more particularly, to an integrated injection logic circuit cell structure and a method for fabricating it with a greater ease resulting partially from a reduction in the number of masking steps.

There is considerable interest currently in semiconductor digital integrated circuits. Such circuits can perform a variety of logic functions which are fundamental to many significant applications such as computers. Known logic circuits include transistor-transistor logic, resistor-transistor logic and diode-transistor logic. Such logic circuits are characterized by a power supply dissipating resistor connected between a power supply and a switching element of the logic circuit. It is often desired to incorporate logic circuits into a large scale integrated circuit structure. In large scale integration, components such as resistors are undesirable because of the relatively large amount of space they usually require.

It is known that such power supply dissipating resistors can be replaced by a transistor. One form of such a circuit is called an injection logic circuit and includes a two-complementary transistor cell which performs a logical inversion. In its usual from, an NPN switching transistor in the cell has its base connected to an input terminal, its collector connected to an output terminal and its emitter connected to ground. A complementary PNP injector transistor is the other transistor in the cell and has its base connected to ground, its emitter connected to a positive voltage source and its collector connected to the base of the switching transistor. In integrated logic circuits, cells are usually connected sequentially by connecting the collector of the switching transistor to the base of a subsequent switching transistor.

In operation, the emitter-base junction of the injector transistor is forward-biased because the base is grounded and the emitter is connected to the positive voltage source. The logical input voltage applied to the base of the switching transistor determines whether the emitter-base junction of the switching transistor is biased on or off. When a logical "1" forward-biases the junction, the current from the collector of the injector transistor flows through the emitter-base path of the switching transistor. The switching transistor conducts in saturation with current supplied by the PNP injector transistor of the next stage and the collector is at a potential equal to the collector-to-emitter saturation voltage of the switching transistor, or a logical "0". Thus a logical "1" has been inverted to a logical "0". When a logical "0" input is applied to the emitter-base junction of the switching transistor, that transistor is turned off and the current from the injector transistor flows out the input through a previous injection logic cell to ground. The collector of the switching transistor provides a logical "1" output because the collector is connected to the voltage source through a subsequent forward-biased injector transistor of a subsequent cell.

It is further known to fabricate p-n junction isolated integrated injection logic circuit structures using two masking steps to form the impurity zones of the transistor. Such methods are described in an article by Horst H. Berger and Siegfried K. Wiedmann entitled "Merged Transistor Logic (MTL) — A low cost Bipolar Logic Concept" and in an article by Kees Hart and Arie Slob entitled "Integrated Injection Logic: A New Approach to LSI." Both articles appear in the *IEEE Journal of Solid State Circuits*, October 1972 at pages 340 and 346, respectively.

Integrated injection logic circuit structures are characterized by having impurity zones which serve as functional parts of two different transistors. That is, the same impurity zone serves as the base of the injection transistor and the emitter of the switching transistor. Also, another zone serves as both the collector of the injection transistor and the base of the switching transistor. Further, when multiple outputs are desired, integrated injection logic circuit structures have a switching transistor with multiple collectors. The multiple collector zones are formed into the surface of the structure and the emitter is buried. This is an inverted transistor structure when compared to a standard buried collector structure.

It would be desirable to improve upon integrated injection logic circuit cell parameters such as size, speed and packing density. Additionally, it would be desirable to reduce the number of masking steps to fabricate injection logic circuits with two levels of metallization. Two levels of metallization are often advantageous in large scale integration of such circuits. Elimination of a masking step usually increases yield and permits smaller size by eliminating re-registration tolerances.

The prior art includes U.S. Pat. No. 3,648,125 issued to D. L. Peltzer on Mar. 7, 1972 which teaches a method of fabricating integrated circuits with oxide isolation. Transistors, diodes and resistors formed in accordance with this patent have smaller size, higher speed and higher packing density than those devices formed using p-n junction isolation.

Straightforward application of the oxide isolation technique to the fabrication of injection logic circuits suggests laterally surrounding each injection logic circuit cell with an oxide region. This reduces the capacitance associated with the p-n junction isolation laterally surrounding the cell. However, such use of oxide isolation does not yeild the desired reduction in size.

SUMMARY OF THE INVENTION

To these and other ends, integrated injection logic circuit cells having two transistors are fabricated in accordance with an embodiment of this invention by selectively patterning an oxide isolation region and using the region in conjunction with steps to form impurity zones and first level metallization.

At least one oxide isolation region is formed into an epitaxial layer of a first conductivity type on a bulk portion of the same conductivity type having a higher impurity concentration than the layer. The oxide isolation region laterally surrounds and isolates portions of the epitaxial layer. The depth of the oxide region is such that a portion of the thickness of the epitaxial layer remains under the oxide region and is suitable for use as part of a lateral base zone in a subsequently formed injector transistor. The oxide isolation region then is used instead of an additional mask to define the boundaries of impurity zones of the second conductivity type formed into the epitaxial layer.

Subsequent to the formation of the zones of the second conductivity type, a pattern of polycrystalline silicon is formed on portions of the surface of the oxide region and the zones of the second conductivity type. The polycrystalline silicon contains impurities of the first conductivity type and is used both as a diffusion source and as a first level metallization. Heating diffuses the impurities of the first conductivity type from the polycrystalline silicon into the underlying zones of the second conductivity type thereby forming at least one pocket of impurities of the first conductivity type. The lateral boundaries of the pocket are defined by the boundaries of the polycrystalline silicon pattern in conjunction with the boundaries of the underlying oxide isolation region.

The pocket just described serves as the collector of the switching transistor. The impurity zone of the second conductivity type formed into the epitaxial layer and contiguous to the pocket serves as the base of the switching transistor. The same zone serves as the collector of the injection transistor. A portion of the epitaxial layer serves as the emitter of the switching transistor and, as already mentioned, the lateral base of the injection transistor. Another impurity zone of the second conductivity type formed into the epitaxial layer serves as the emitter of the injection transistor.

Processing is simplified by eliminating a masking step when forming zones of the second conductivity type impurities in the epitaxial layer. It is further simplified by using only one masking step to form both the pocket and a first level metallization pattern. Thus, only two masking steps are required through a first level metallization.

The resulting injection logic circuit cell structure is advantageous because of high speed and high packing density. This is due to the smaller size permitted by eliminating some masking re-registration tolerances and using the oxide isolation region to partially define an impurity zone.

DETAILED DESCRIPTION

Figure 1:
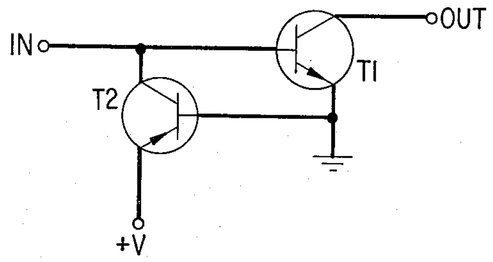
FIG. 1 shows a schematic drawing of an injection logic circuit.

FIG. 1 shows a schematic drawing of a two transistor integrated injection logic circuit cell. Transistor T1 is the switching transistor and transistor T2 is the injection transistor. An oxide isolated integrated circuit structure for such a cell can be fabricated in accordance with this invention.

Figure 2:
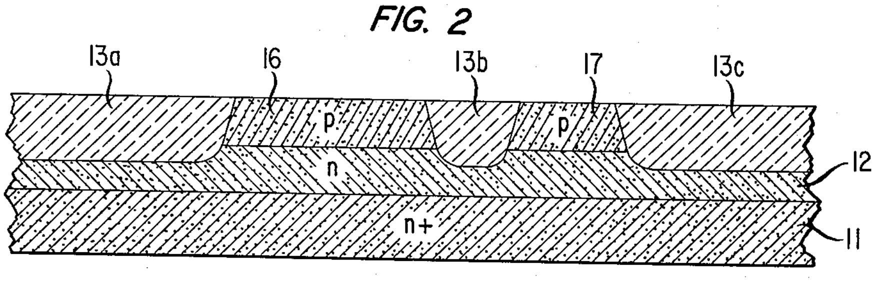
FIGS. 2 through 5 show a cross-section view of a semiconductor wafer as it appears after successive processing steps performed on the semiconductor wafer in accordance with an embodiment of this invention.

Referring to FIG. 2, fabrication in accordance with an embodiment of this invention begins by forming a monocrystalline silicon bulk portion 11 which may be a portion of an n-type conductivity slice produced by arsenic doping to have a substantially uniform resistivity of about 0.01 ohm-centimeter. Then an n-type epitaxial layer 12, also shown in FIG. 2, is formed on bulk portion 11. Typically, layer 12 has a resistivity of a few tenths ohm-centimeters and is formed to a thickness of about 2 microns.

In accordance with known methods, an oxide isolation region is formed into layer 12. Such methods are described in U.S. Pat. No. 3,648,125 issued to D. L. Peltzer. A cross-section of the oxide region is shown in FIG. 2 as regions 13*a*, 13*b* and 13*c*. The oxide isolation region is formed to a depth of about 1.5 microns so there remains a crossunder of epitaxial layer suitable for use later as a lateral base region.

The oxide region is then used instead of an additional mask to define an implantation of p-type impurities thereby forming impurity zones 16 and 17. A typical implant uses impurities such as boron to form two overlapping peaked distributions, one shallow and the other deep. The distribution having a shallow peak has a high concentration of impurities to provide improved ohmic contact to the impurity distribution having a deep peak. For example, the shallow distribution can be made by implanting boron ions at a concentration of about $10^{14}$ per square centimeter with an implantation voltage of about 30 kilovolts. The deep distribution can be made by implanting boron ions at a concentration of about $3 \times 10^{12}$ per square centimeter with an implantation voltage of about 130 kilovolts. The boron ions are substantially concentrated at a depth less than the depth of the oxide isolation region. In this embodiment the peak of the deep distribution is approximately 0.4 microns from the surface of the epitaxial layer.

Figure 3:
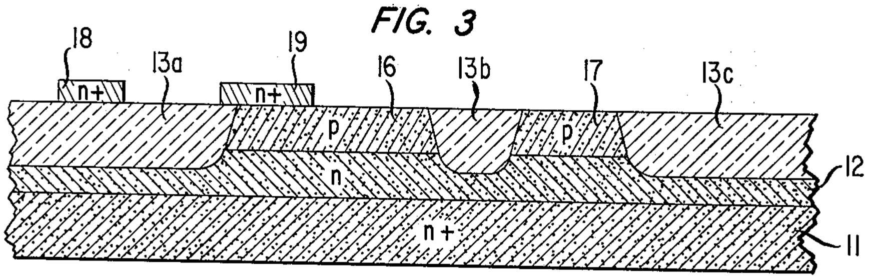

FIG. 3 shows polycrystalline silicon interconnection regions 18 and 19. In a typical process, a layer of undoped polycrystalline silicon about one-half micron thick is deposited on the surface of the structure shown in FIG. 2 so the polycrystalline silicon overlies oxide region 13 and p-type impurity zones 16 and 17. Subsequently, n-type impurities are diffused into the polycrystalline silicon to make it heavily doped. For example, arsenic can be introduced to produce a sheet resistivity of about 50 ohms per square. The impurities can be diffused into the polycrystalline silicon either from an impurity vapor or by depositing an oxide containing the impurities over the polycrystalline silicon and then heating to diffuse the impurities from the oxide into the polycrystalline silicon. Advantageously, the diffusion steps are controlled to prevent diffusion of impurities beyond the polycrystalline silicon. Impurities can also be introduced by implantation to avoid a high temperature step and the possibility of premature diffusion into regions 16 and 17.

Subsequent to the introduction of impurities into the polycrystalline silicon, a masking step and an etching step are used to pattern the polycrystalline silicon to form first level interconnection regions 18 and 19. If a doped oxide is used for the introduction of n-type impurities, it is removed. Further, if n-type impurities entered any portion of p-type zones 16 or 17 not beneath the polycrystalline interconnection region 19, then the surfaces of those zones are advantageously etched to remove the n-type impurities.

Figure 4:
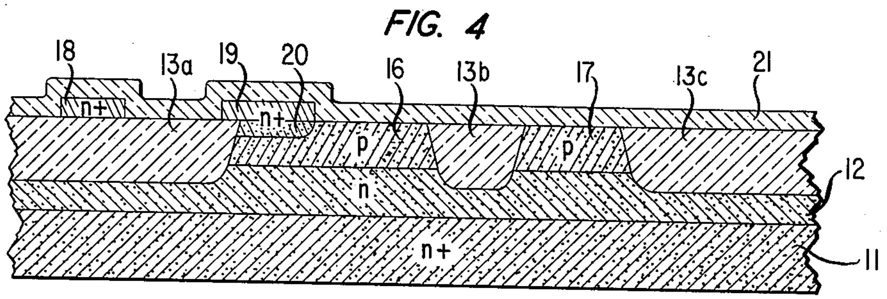

Interconnection region 18 can be patterned to provide interconnection with other circuits. Interconnection region 18 overlies oxide region 13 and can also overlie those semiconductor regions to be interconnected. Interconnection region 19 can be used as an n-type impurity zone in a transistor as well as an interconnection. Further, region 19 can be used as a diffusion source of n-type impurities to form in the underlying semiconductor region n-type impurity zones suitable for use in a transistor. Accordingly, region 19 overlies a p-type semiconductivity region and can extend over an adjacent oxide isolation region to reduce the requirements on mask alignment. If desired interconnection regions 18 and 19 can be connected. To better prevent the diffusion of impurities into the semiconductor region not underlying region 19, an insulator cap 21, shown in FIG. 4, can be formed over the entire surface of the semiconductor wafer. For example, a material such as silicon dioxide can be nonselectively deposited on the semiconductor wafer. Heating diffuses impurities from region 19 into the underlying semiconductor region thereby forming an n-type impurity zone 20, as shown in FIG. 4. Masking and etching forms contact openings in the insulator cap for use with a second level metallization. Such a cap can also act as an insulator beneath a subsequent second level of interconnection.

Figure 5:
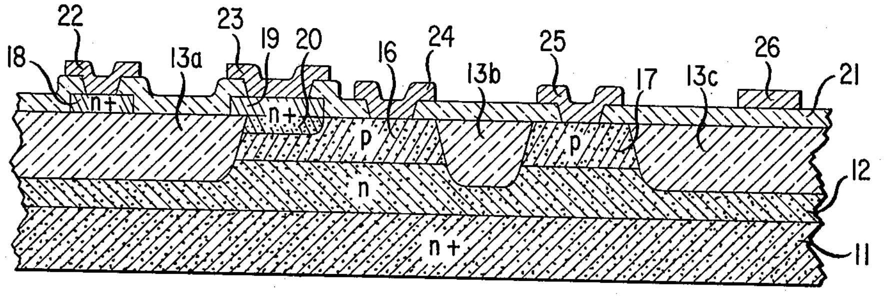

The second level metallization can be formed by depositing and patterning such materials as gold, aluminum, titanium and palladium. The second level metallization overlies the insulator cap and can selectively contact, through openings in the insulator cap, semiconductor zones and portions of the first level interconnection. FIG. 5 shows the contact openings and second level metallization regions 22, 23, 24, 25 and 26. Regions 22 and 23 contact first level interconnection regions 18 and 19, respectively. Regions 24 and 25 contact impurity zones 16 and 17, respectively. Region 26 overlies only layer 12. The second level metallization can be used in conjunction with first level interconnection to connect the integrated injection logic cell to other circuits and external voltages. Two levels of interconnection require less space than a single level of interconnection because some lateral spacing requirements can be eliminated when one level can cross over another level. Only four masking steps have been used through a second level metallization.

The integrated injection logic cell structure of FIG. 5 can be used in various known combinations for realizing any kind of complex logic. An NPN switching transistor is formed of zones 11, 12, 16 and 20. Zones 11 and 12 form the emitter, zone 16 forms the base and zone 20 forms the collector. A PNP injector transistor is formed of zones 17, 12 and 16. Zone 16 forms the collector, zone 12 forms the base and zone 17 forms the emitter. Zone 11 provides an improved ohmic contact to emitter zone 12 and also improves injection efficiency of carriers from zone 12 through zone 16 into zone 20.

The structure is advantageous compared to a p-n junction isolated structure because the oxide isolation reduces capacitance by eliminating p-n junction capacitance. Fabricating in accordance with an embodiment of this invention also reduces the size of the structure by reducing the number of masking steps and thereby reducing the space needed for the registration tolerance required by the masking step. Gain is increased and minority carrier storage is decreased by comparison with a p-n junction isolated structure Lower capacitance and lower minority carrier storage, in turn, improve the switching speed of a transistor.

Various other modifications and variations will no doubt occur to those skilled in the various arts to which this invention pertains. For example, impurities could be introduced by implantation, diffusion or other suitable means. Further, switching transistors with multiple collectors to provide multiple outputs can be formed and the metallization pattern can be varied.

What is claimed is:

1. In a method for fabricating a semiconductor integrated injection logic cell structure having an injection transistor and a complementary switching transistor including the steps of forming on a semiconductor bulk portion of a first conductivity type a semiconductor epitaxial layer of the same conductivity type and having a lower concentration of first conductivity type impurities than the bulk portion and forming in the semiconductor a lateral and an inverted transistor, the improvement being the steps of:

forming at least one region of oxide isolation extending partially through the thickness of the epitaxial layer and laterally surrounding and isolating portions of the eptiaxial layer so the epitaxial layer is suitable for use as an emitter for the switching transistor and the portion of the epitaxial layer in the remaining thickness is suitable for use as a lateral base for the injection transistor, introducing impurities of a second conductivity type into the portions of the epitaxial layer laterally surrounded by the oxide isolation region to form one zone suitable for use as an emitter for the injector transistor and another zone suitable for use both as a collector for the injector transistor and a base for the switching transistor, forming an interconnection pattern comprising regions of polycrystalline silicon containing impurities of the first conductivity type partially overlapping both the oxide isolation region and one of the isolated portion of the epitaxial layer, and diffusing impurities of the first conductivity type from the interconnection pattern into the underlying semiconductive material to form at least one impurity pocket suitable for use as a collector for the switching transistor.

2. A method as recited in claim 1 wherein sufficient impurities are introduced into the bulk portion to produce a resistivity of about 0.01 ohm-centimeter and into the epitaxial layer to produce a resistivity of about 0.1 ohm-centimeter.

3. A method as recited in claim 1 wherein the epitaxial layer is formed to a thickness of about 2 microns and the oxide isolation region is formed to a depth of about 1.5 microns.

4. A method as recited in claim 1 wherein the impurities of the second conductivity type are introduced into the substrate by implantation.

5. A method as recited in claim 4 wherein the implantation includes an implantation of impurities at a concentration of about $10^{14}$ per square centimeter with an implantation voltage of about 30 kilovolts and an implantation of impurities at a concentration of about $3 \times 10^{12}$ per square centimeter with an implantation voltage of about 130 kilovolts.

6. A method as recited in claim 1 wherein the impurities of the second conductivity type are introduced into the substrate by diffusion.

7. A method as recited in claim 1 further comprising the step of forming an insulating cap on the interconnection pattern and the exposed semiconductive material before diffusing impurities from the interconnection pattern into the semiconductive material underlying the interconnection pattern.

* * * * *